United States Patent [19]
Hartmann

[11] 3,946,342
[45] Mar. 23, 1976

[54] WEIGHTING SURFACE WAVE FILTERS BY WITHDRAWING ELECTRODES

[75] Inventor: Clinton S. Hartmann, Dallas, Tex.

[73] Assignee: Texas Instruments Incorporated, Dallas, Tex.

[22] Filed: Aug. 10, 1973

[21] Appl. No.: 387,561

[52] U.S. Cl................... 333/72; 310/9.8; 333/30 R
[51] Int. Cl.² H03H 9/20; H03H 9/26; H01L 41/10; H01L 41/22
[58] Field of Search ......... 333/30 R, 72; 310/8, 8.1, 310/8.2, 8.3, 9.3, 9.7, 9.8

[56] References Cited
OTHER PUBLICATIONS de Klerk – "Ultrasonic Transducers 3, Surface Wave Transducers" in Ultrasonics Jan. 1971, pp. 39–41.
Dieulesaint et al. – "Acoustic Surface Wave Filters" in Ultrasonics Jan. 1973; pp. 25–30.
Hartemann et al. – "Intrinsic Compensation of Sidelobes in Dispersive Acoustic Delay Line" in Electronic Letters Vol. 5., No. 10, May 15, 1969, pp. 219–220.

*Primary Examiner*—Archie R. Borchelt
*Assistant Examiner*—Marvin Nussbaum
*Attorney, Agent, or Firm*—Harold Levine; James T. Comfort; William E. Hiller

[57] ABSTRACT

Prior art methods for shaping the impulse response of a surface wave delay line interdigital transducer include finger width weighting and finger overlap weighting. The new method for shaping the transducer impulse response disclosed herein overcomes several objectional characteristics of the prior art methods. The new method involves removal of individual fingers or groups of fingers from selected portions of the transducer. The amplitude of the impulse response in those regions from which fingers have been removed is reduced below the value which it would have if no fingers had been removed. The method thus provides the capability to control the relative amplitudes of the impulse response along the length of the transducer.

18 Claims, 12 Drawing Figures

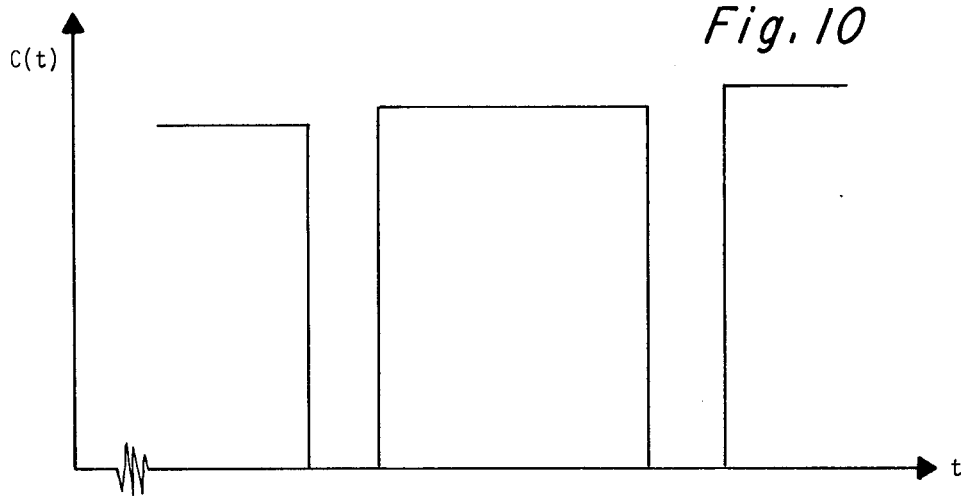
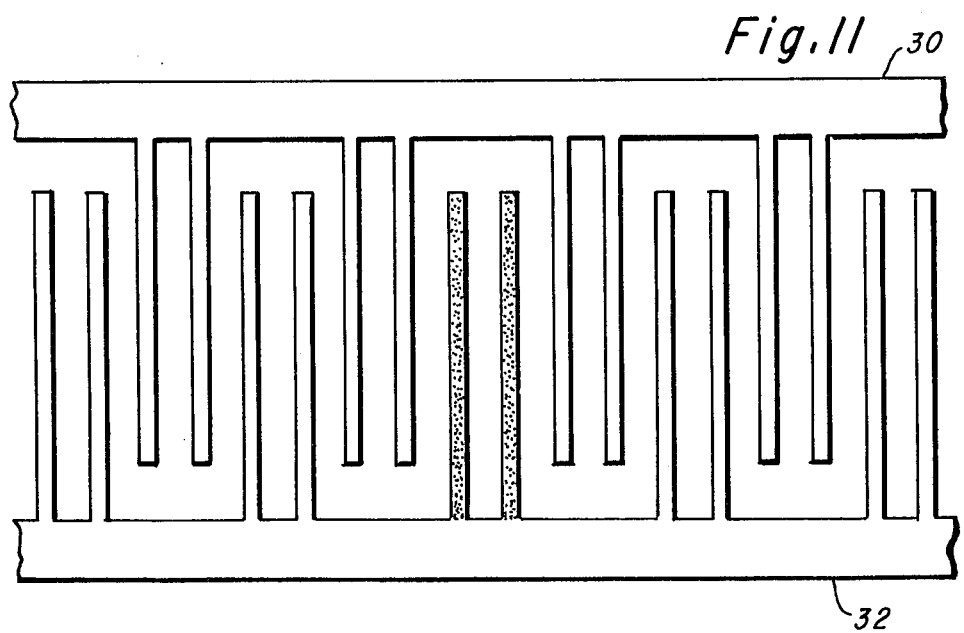

WEIGHTING SURFACE WAVE FILTERS BY WITHDRAWING ELECTRODES

This invention relates to surface wave delay lines and in particular to interdigital transducers for surface wave delay lines.

The most basic type of surface wave delay line interdigital transducer consists of a plurality of interdigitated fingers where the fingers are all equa-spaced and of equal length. As is well known in the art, the frequency response of such an interdigital transducer can be described by a sin x/x function where the center frequency of this sin x/x response is determined by the spacing between adjacent fingers and the width of the main lobe of the sin x/x function is related to the overall length of the transducer. For most devices of interest this is not a desirable frequency response and it is necessary to modify the response by weighing the transducer array. There are two standard techniques for accomplishing this weighing. In the first case, the width of the various interdigitated fingers are varied in some predetermined fashion thereby resulting in surface wave excitation which varies in amplitude along the length of the transducer. This method is rather severely limited in that only about a four fold variation in widths is practically achievable and as a result the achievable range of coupling strengths is only approximately 1.6. For most purposes this is not sufficient to permit the design of the required impulse responses. This dynamic range can be increased to a useable figure by operating the transducer array at one of its odd harmonics. This is undesirable however, because it reduces the effective coupling coefficient of the substrate thereby increasing the insertion loss. In addition, the exact line widths become extremely critical in harmonic operation to the extent that even with state-of-the-art fabrication techniques the yield for devices operating above 30 MHz is very low.

The second standard technique may be referred to as overlap weighting, that is varying the length of the interdigitated fingers, thereby resulting in an effective excitation region between adjacent fingers which varies as a function of distance along the transducer length. The dynamic range of the coupling strength acievable with this method is generally sufficient for most current applications. However, this method has several other limitations. The most serious limitation stems from the fact that the desired weighing is only achieved if the overlap weighted transducer array is used in a filter whose second transducer array has uniform overlap. Thus, it is only possible to design a filter with one weighted transducer array and consequently the flexibility available to the filter designer is severely limited. In addition, overlap weighting leads to non-uniform distribution of acoustic energy across the acoustic beam thereby resulting in additional insertion loss. Finally, the narrow overlap in certain regions of the transducer array makes it more susceptible to beam spreading problems.

In the weighting method disclosed herein, all of the interdigitated fingers have uniform widths and full overlap. As a result, the new interdigital transducers are not subject to the most serious limitations of width and overlap weighing methods.

Briefly the method permits the design of an interdigital transducer whose impulse response approximates some desired impulse response. The desired impulse response is characterized by an envelope function and a zero-crossing function, the former as its name applies, defining those time points at which the impulse response passes through zero. The design begins with an interdigital transducer having a zero-crossing function identical to that of the desired impulse response and an envelope function which is everywhere equal to or greater than that of the desired impulse response. The interdigitated fingers of this beginning transducer are all of equal width and of uniform overlap. The method provides a procedure for removing from the beginning transducer selected fingers or groups of fingers, the result of this withdrawal procedure being an interdigital transducer whose envelope function approximates that of the desired impulse response. The nature of the approximation is that within a given length of the transducer the area under the envelope function of the finger withdrawal weighted array is approximately equal to the area for the corresponding lengths under the envelope functions of the desired impulse response with exact equivalence occurring over the full length of the transducers.

It is therefore an object of this invention to provide a new method for the weighting of interdigital transducer arrays.

It is another object to provide a weighted transducer array wherein the dynamic range of the weighting is large enough to be suitable for most devices.

It is a further object of this invention to provide an interdigital transducer array wherein necessary constraints on the accuracies of the finger widths are practically realizable.

It is still a further object to provide a weighted interdigital transducer array such that both arrays of a given filter may be weighted.

It is still a further object to provide a method for the design of weighted intergital transducer arrays wherein the weighting is accomplished by means of finger withdrawal.

Other objects and features of the invention will be made clear by consideration of the following detailed disclosure and drawings wherein FIG. 1 shows a conventional interdigital transducer.

FIG. 10 is the envelope function of the central portion of a finger withdrawal array.

FIG. 11 shows a portion of a split finger interdigital transducer.

Figure 1:
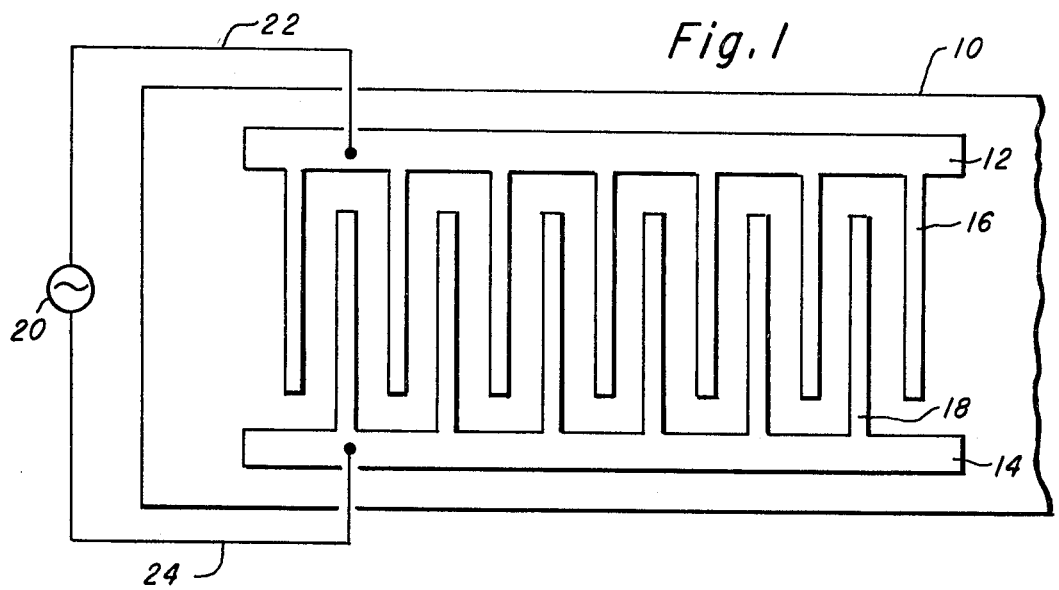

With reference to FIG. 1, there is illustrated a portion of a surface wave delay line including an input interdigital transducer array. The surface wave delay line may be fabricated on a substrate 10 of a convenient piezoelectric material such as lithium niobate or quartz. Fabricated thereon is an input interdigital transducer array comprised of upper and lower conductive pads 12 and 14 and interdigitated fingers 16 and 18. The interdigital transducer array is normally composed of a thin film of conductive material such as gold or aluminum. Methods for fabrication of such arrays are well known in the art and need not be discussed here. The upper and lower portions of the transducer array are coupled by means of lines 22 and 24 to an external signal source 20. As illustrated in the figure, the interdigitated fingers 16 and 18 are all of uniform width and the overlap region between adjacent fingers is uniform along the length of the transducer.

Figure 2:
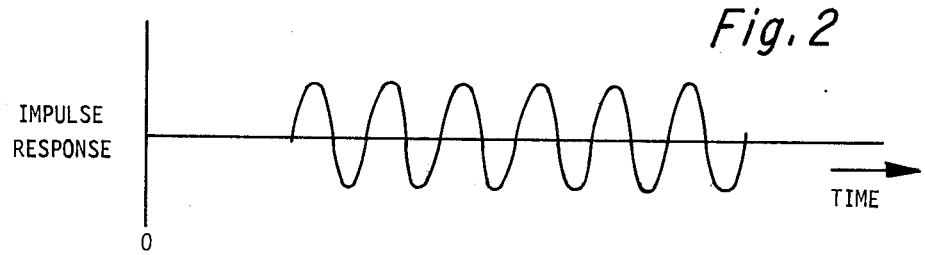
FIG. 2 illustrates the impulse response of a conventional interdigital transducer.

Operationally, at any given instant in time, external source 20 will impress across the upper and lower portions of the transducer array some value of voltage and it will be seen from an examination of the figure that the voltages applied to any pair of adjacent fingers will be of opposite polarity. It follows that electric fields will exist in the substrate in the regions intermediate to the interdigitated fingers and as a result of the piezoelectric characteristics of the substrate material, these electric fields will induce strains in the material which propagate away from the interdigital transducer in the form of acoustic surface waves. If the output of source 20 is an electrical impulse function, then the strains associated with the acoustic surface wave propagating away from the transducer will have the wave form illustrated in FIG. 2. This wave form is of course, the impulse response of the transducer. While the exact nature of the impulse response may be difficult to predict analytically, it is valid to consider as a first approximation that that portion of the impulse response corresponding to any given pair of interdigitated fingers is one-half cycle of a sine wave.

The zero-crossings of the impulse function correspond to the centers of the interdigitated fingers and the amplitude of each sine wave half cycle is proportional to $(1/2T)^{3/2}$, where T is the time delay between the zero-crossings. This time delay is directly proportional to the spacing between the pair of interdigitated fingers which give rise to the half cycle of the sine wave. In the practice of this invention the transducer to be designed is described by means of its desired impulse response.

Figure 3A:
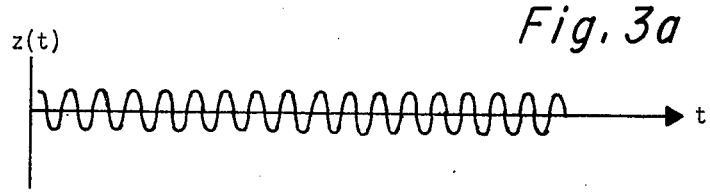
FIGS. 3a and 3b show, respectively, a zero crossing and envelope function of a desired impulse response.
Figure 3B:
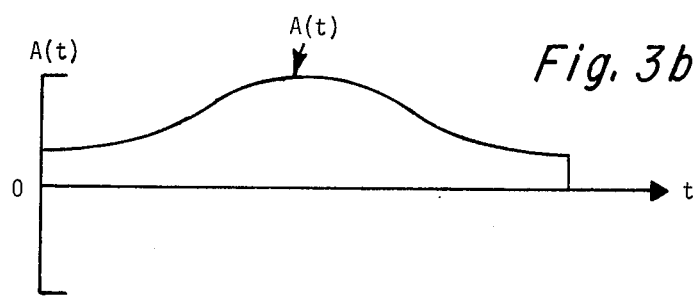

The desired impulse response can be characterized by two functions, $A(t)$ and $Z(t)$ as illustrated in FIGS. 3a and 3b. $A(t)$ is an envelope function constructed so as to just enclose the greatest extremities of the desired impulse response function. $Z(t)$ describes the zero-crossings of the desired impulse response function. While the zero-crossings of the function illustrated in 3a are equa-spaced, $Z(t)$ may in general have some other temporal behavior. The zero-crossings of $Z(t)$ for example might correspond to those of a linear FM chirp.

Figure 4:
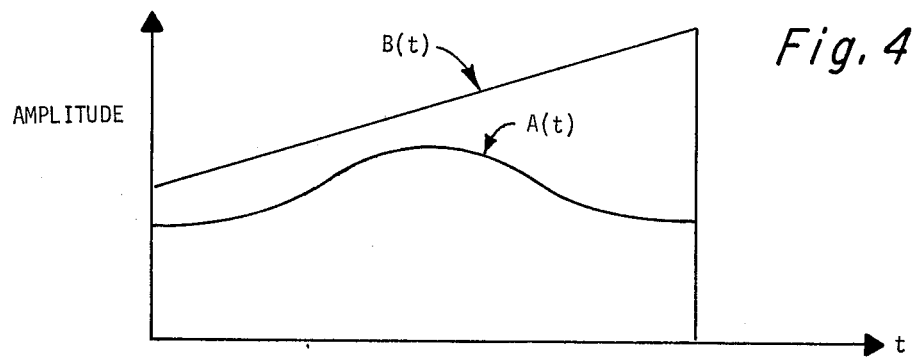
FIG. 4 shows the envelope functions of a desired and beginning impulse response.

In the finger withdrawal method, the starting point for approximating the desired impulse response is a uniform overlap interdigital transducer. The zero-crossings of the impulse response of this transducer will be identical with those of the $Z(t)$ function for the desired impulse response. A typical envelope function of this uniform overlap transducer is shown as $B(t)$ in FIG. 4. It will be recognized that this envelope function having a uniformly increasing slope is that of a linear FM chirp transducer. The reason for the increasing slope may be understood by consideration of the configuration of such an interdigital transducer. As is well known in the art, the spacing between the interdigitated fingers of such a transducer will be greater at one end of the transducer than at the other, the spacing increasing linearly along the length of the transducer. As pointed out above, the amplitude of each half cycle of sine wave in the transducer impulse response is proportional to $(1/2T)^{3/2}$. As a result, the amplitude of the impulse response stemming from that portion of the transducer where the finger spacing is large, will have an amplitude less than that portion of the impulse response stemming from the portion of the transducer where the finger spacing is small. Also shown in FIG. 4 is the envelope function $A(t)$ of a desired impulse response.

Figure 5:
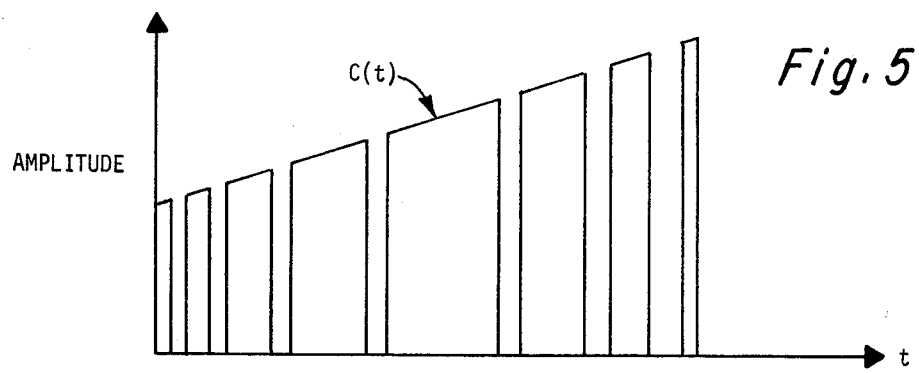
FIG. 5 is the envelope function of a typical finger withdrawal array.

In FIG. 5 is shown the envelope function $C(t)$ of the finger withdrawal transducer impulse response which approximates the desired impulse response. This envelope function $C(t)$ is that of an interdigital transducer which is obtained from the original transducer having envelope function $B(t)$ by removal of appropriately selected interdigitated fingers or groups of fingers. The impulse response of the finger withdrawal transducer is zero for those times corresponding to portions of the transducer from which fingers have been removed. Thus, there are intervals of the $C(t)$ function for which the envelope will have a zero value. The $C(t)$ envelope function approximates the desired $A(t)$ envelope function in the sense that the total area under both of these functions is identical. Moreover, in any interval along the time axis the total area under that interval of the $C(t)$ function closely approximates the area under the corresponding interval of the $A(t)$ function. It is in this sense that the impulse response of the transducer designed by the finger withdrawal method approximates the desired impulse response.

A procedure for selecting the appropriate fingers for removal will now be discussed. First, the time integral, $IA(t)$ of the $A(t)$ function is computed.

$$IA(t) = \int_0^t A(\tau)\, d\tau$$

Figure 6:
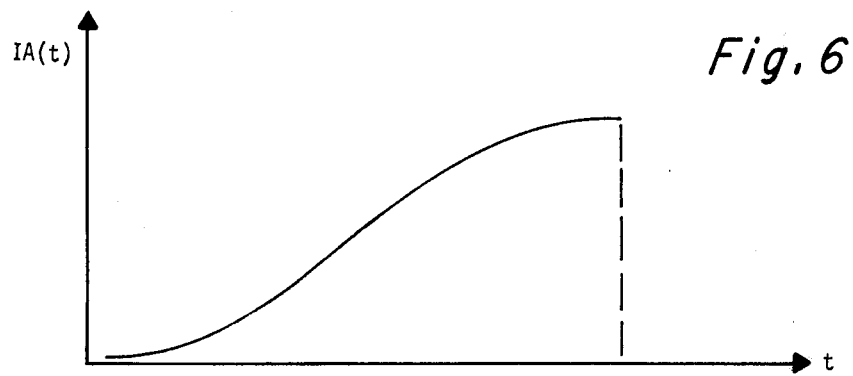
FIG. 6 illustrates an integrated envelope function.

The $IA(t)$ function corresponding to the $A(t)$ function of FIG. 4 is illustrated in FIG. 6. The finger withdrawal transducer to be designed is initially considered to have no interdigitated fingers. Appropriate finger pairs from the original transducer, that is the transducer represented by the $B(t)$ envelope are added to the finger withdrawal transducer so as to make its envelope function $C(t)$ approximate the $A(t)$ envelope function in the sense described above. Each of the adjacent finger pairs of the original transducer gives rise to one-half cycle of a sine wave in the impulse response of the original transducer, the amplitude of which is proportional to $(1/2T)^{3/2}$. Thus, each adjacent finger pair in the original transducer contributes an area to the $B(t)$ function which is equal to the product of this amplitude and the time duration of the half cycle of sine wave. This time duration is the time required for a surface wave to propagate over the distance between the adjacent fingers. In the following, each of these contributions of the adjacent finger pairs of the original transducer will be referred to as full over-lap interactions.

Figure 7:
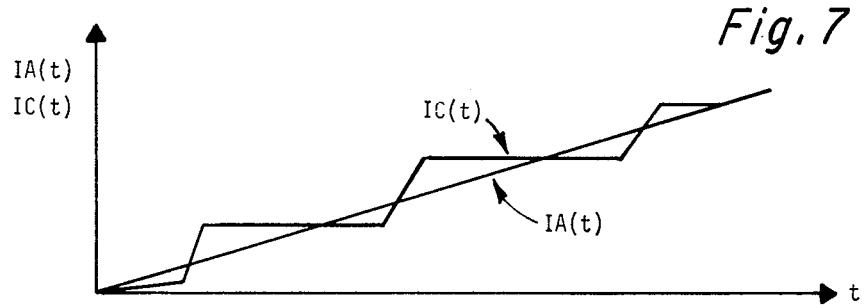
FIG. 7 shows the development of the first portion of a finger withdrawal array.
Figure 8:
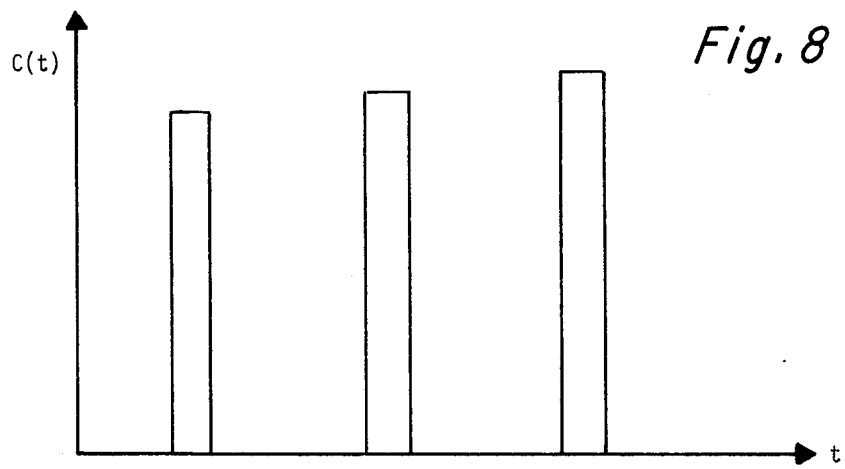
FIG. 8 is the envelope function of the first portion of a finger withdrawal array.

The $IA(t)$ function is compared as a function of time beginning at $t = 0$ with the original transducer. At the first time when the value of $IA(t)$ is equal to ½ the area corresponding to a full overlap interaction occuring at this same time the finger pair of the original transducer giving rise to this full overlap interaction is added to the finger withdrawal transducer. The addition of this finger pair to the finger withdrawal transducer results in a finite contribution to its envelope function $C(t)$ and also to its integrated envelope function $IC(t)$. FIG. 7 illustrates typical $IA(t)$ and $IC(t)$ functions for small values of time. It will be noted here that while the $IA(t)$ function is monotonically increasing for small values of time the $IC(t)$ function maintains its zero value until the point is reached at which the first finger pair is introduced to the finger withdrawal transducer. At this point there is a linear increase in the value of the $IC(t)$ function extending over that time interval corresponding to the distance between the adjacent fingers which were added to the finger withdrawal transducer. From this point, the algebraic difference between the $IA(t)$ function and the $IC(t)$ function is compared with the original transducer as a function of time until a new time is located at which this difference again equal one-half the area in a full overlap interaction occurring at this new time. At this point, the finger pair giving rise to this second full overlap interaction is added to the finger withdrawal transducer giving rise to the second linear increase in the $IC(t)$ function of FIG. 7. Note that for those times intermediate to the times at which finger pairs are added to the finger withdrawal transducer, the $IC(t)$ function has a zero slope. FIG. 8 shows the resultant envelope function $C(t)$ of the finger withdrawal transducer for small values of time. In view of the small slope of the $IA(t)$ function in this region, the finite contributions to the $C(t)$ function representing individual finger pairs in the finger withdrawal transducer occur at relatively wide intervals in time. The design is completed by continuing this comparison of the difference between the $IA(t)$ and $IC(t)$ functions with the original transducer throughout those values of time corresponding to the length of the transducer.

Figure 9:
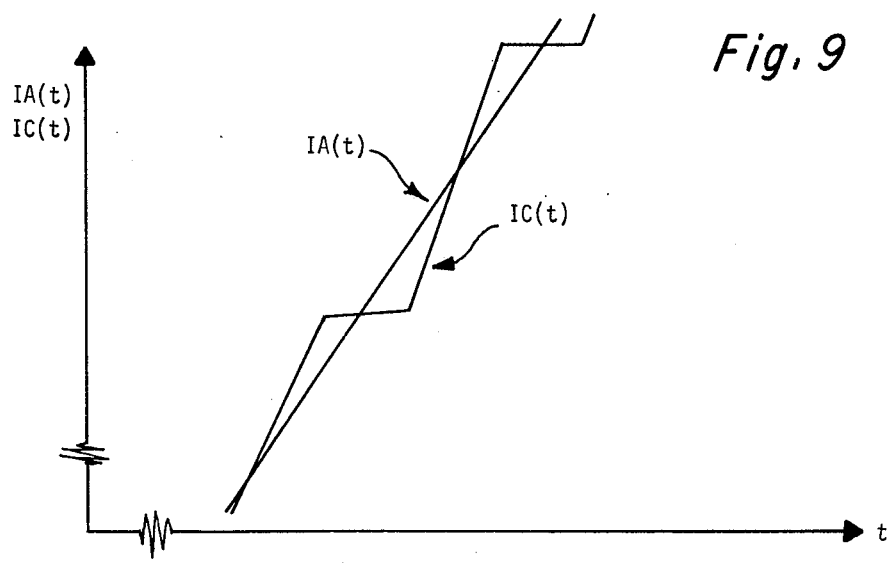
FIG. 9 shows the development of the central portion of a finger withdrawal array.

Representative values of the $IA(t)$ and $IC(t)$ functions corresponding to the central region of the transducer are illustrated in FIG. 9. In this region where the slope of the $IA(t)$ function has its greatest value, the density of finger pairs added to the finger withdrawal transducer is greater than was the case for earlier times represented by FIG. 7. The $C(t)$ function corresponding to this central time interval is illustrated in FIG. 10. In this design procedure it will be noted first that all of the finger pairs added to the finger withdrawal transducer are full overlap pairs. Secondly, each of the finger pairs added to the finger withdrawal transducer occupies the same location along the length of the transducer as it did in the original transducer, thus the zero-crossings in the finger withdrawal transducer corresponding to these finger pairs will occur at the same times in the impulse response as they did in the impulse response of the original transducer. It should be noted that while in this description of the invention, fingers were added to the finger withdrawal in pairs, this need not always be the case. When the procedure results in the addition of a plurality of contiguous full overlap interactions to the finger withdrawal transducer, only the first interaction will require addition of a finger pair while subsequent interactors require the addition of only a single finger. Also, while the procedure has been described as the addition of appropriate full overlap interactors to the finger withdrawal transducer, the end result is the original transducer with selected fingers withdrawn, thus the term finger withdrawal transducer.

In summary, the invention consists of a new interdigital transducer for surface wave delay lines and a method for the design of the new transducer. The desired impulse response of the new finger withdrawal transducer is characterized by a desired envelope function $A(t)$ and a desired zero-crossing function $Z(t)$. The design starts with a conventional interdigital transducer which has a zero-crossing function identical to the desired zero-crossing function $Z(t)$ of the new transducer. By appropriate comparison of the desired envelope function $A(t)$ the realized envelope function $C(t)$ with the original transducer as discussed above, appropriate finger pairs from the original transducer are incorporated in the finger withdrawal transducer. This results in an approximation wherein the area under the total realized envelope function $C(t)$ of the finger withdrawal transducer is equal to the area under the total desired envelope function $A(t)$. Moreover, within any reasonably extensive segment of the transducer, the area under the realized envelope function $C(t)$ will be approximately equal to the area under the corresponding interval of the desired envelope function $A(t)$.

While the description of the invention has embodied a specific desired envelope function $A(t)$ and zero-crossing function $Z(t)$, it will be recognized that the invention is not restricted to this particular embodiment. Other variations within the scope of the invention include but are not limited to the following. The invention can be practiced even when the condition of uniform full overlap is not met or when the finger locations deviate from those specified by the zero-crossing function. Such deviations may be desirable to fine tune the transducer, and may exist in the "original" transducer or may constitute modifications to the finger withdrawal transducer. It may also be desirable in some cases to reverse the phase of a finger rather than to withdraw it, that is to connect the finger to the pad opposite the one to which it was connected in the original transducer rather than to withdraw it completely.

Finger withdrawal weighting is also applicable to split finger interdigital transducers. FIG. 11 illustrates a portion of a split finger transducer comprised of upper and lower conductive segments 30 and 32. In this type of transducer, each electrode is in effect split into two fingers with the spacing between these two fingers being ¼ wavelength. This has the effect of substantially reducing the problem of inter-electrode reflections. In this case finger withdrawal weighting may be accomplished by removal of pairs of fingers such as the shaded pair of FIG. 11. Alternatively it may sometimes be desirable to, in addition, remove the nearest finger on both sides of the pair to be removed.

What is claimed is:

1. A method for fabricating an acoustic surface wave interdigital transducer having an impulse response with predetermined relative amplitudes along the length thereof, said method comprising:
    defining the desired impulse response of the interdgital transducer to be fabricated,
    designing an interdigital transducer provided with opposed sets of overlapping fingers and having an impulse response with the same zero-crossings as the desired impulse response, and
    withdrawing one or more selected fingers from the designed interdigital transducer to produce an interdigital transducer having an impulse response approximating the desired response.

2. A method set forth in claim 1, wherein the definition of the impulse response of the interdigital transducer to be fabricated is determined by a desired envelope function and a desired zero-crossing function.

3. A method as set forth in claim 2 wherein each corresponding pair of overlapping fingers in the opposed sets of overlapping fingers in the designed interdigital transducer are uniformly overlapped.

4. A method as set forth in claim 2 wherein the length of the fingers of the designed interdigital transducer selected for withdrawal are so chosen as to produce an interdigital transducer having non-uniform finger overlap along its length.

5. A method as set forth in claim 2 wherein the overlapping fingers of the opposed sets thereof in the designed interdigital transducer are provided with varying lengths so as to result in non-uniform finger overlap along the length of the designed interdigital transducer.

6. A method as set forth in claim 2 wherein the fingers selected for withdrawal from the designed interdigital transducer are so chosen to produce an interdigital transducer with the positions of the interdigitated fingers thereof varying along its length.

7. A method as set forth in claim 2 wherein the designed interdigital transducer is a split finger interdigital transducer.

8. A method as set forth in claim 2 wherein the withdrawal of selected fingers from the designed split finger interdigital transducer is accomplished by removing interdigitated fingers in pairs.

9. A method as set forth in claim 8 wherein the nearest interdigitated finger on each side of said pairs is withdrawn.

10. A method as set forth in claim 2 further including replacing at least one of the withdrawn fingers on the interdigital transducer by connecting the replaced finger to the conductive pad for the opposite set of fingers from the pad of the set from which the finger was originally withdrawn.

11. A method of fabricating an acoustic surface wave full-overlap interdigital transducer having an impulse response with predetermined relative amplitudes along the length thereof, said method comprising:
defining the desired impulse response of the full-overlap interdigital transducer to be fabricated by a desired envelope function and a desired zero-crossing function,
designing a full-overlap interdigital transducer provided with opposed sets of fully overlapping fingers and having an impulse response with the same zero-crossings as the desired impulse response, and
withdrawing appropriate selected fingers from the designed full-overlap interdigital transducer so that the area under the envelope function of the full-overlap interdigital transducer and the area under said desired envelope function are equal over the full transducer length and approximately equal over any portion of the full transducer length in the full-overlap interdigital transducer which is produced.

12. A method as set forth in claim 11, wherein the production of the full-overlap interdigital transducer further includes:
computing a first time integral of said desired envelope function,
computing a second time integral of the envelope function of the full-overlap interdigital transducer to be produced,
comparing with the designed full-overlap interdigital transducer the algebraic difference between said first and second time integrals as a function of time beginning at time zero to find a first time at which said algebraic difference is equal to one-half of the full-overlap interaction which occurs in the designed full-overlap interdigital transducer at said first time,
including in said full-overlap interdigital transducer to be produced at said first time the interdigitated finger pair which contributes full-overlap interaction,
adjusting said second time integral of said full-overlap interdigital transducer to be produced to account for the addition of said interdigitated finger pair, and
repeating the sequence of steps for determining respective interdigitated finger pairs of the full-overlap interdigital transducer to be produced along the entire length thereof in comparison to the designed full-overlap interdigital transducer.

13. An acoustic surface wave full-overlap interdigital transducer having an impulse reponse with predetermined relative amplitudes along the length thereof in approximation of a desired impulse response, said interdigital transducer comprising:
opposed sets of overlapping fingers of equal length and width,
said equal length interdigitated fingers being a subset of a set comprising an interdigitated finger corresponding to each zero-crossing of the desired impulse response, and
said subset being selected so as to provide the approximation of the desired impulse response.

14. A full-overlap interdigital transducer as set forth in claim 13 wherein the selected subset includes equal length interdigitated fingers which are arranged so that the area under the envelope function of the desired impulse response and the area under the envelope function of the full-overlap interdigital transducer are equal over the full length of the impulse response and approximately equal over any partial length of the impulse response.

15. A full-overlap interdigital transducer as set forth in claim 13, wherein at least one of said full-overlap interdigitated fingers is positioned at a location out of correspondence to a zero-crossing of the desired impulse response.

16. A full-overlap interdigital transducer as set forth in claim 15 wherein said interdigital transducer is a split finger transducer.

17. A method of fabricating an acoustic surface wave interdigital transducer having an impulse response with predetermined relative amplitudes along the length thereof, said method comprising:
defining the desired impulse response of the interdigital transducer to be fabricated by at least a desired envelope function,
designing an interdigital transducer provided with opposed sets of overlapping fingers and having an impulse response with an envelope function which is everywhere equal to or greater than that of the desired impulse response so as to produce an impulse response differing from but related to the desired impulse response, and
withdrawing one or more selected fingers from predetermined locations on the designed interdigital transducer corresponding to positions on the envelope function which are greater than the respective positions on the envelope function of the desired impulse response to produce an interdigital transducer having an impulse response approximating the desired impulse response.

18. A method as set forth in claim 17, wherein each corresponding pair of overlapping fingers in the opposed sets of overlapping fingers in the designed interdigital transducer are uniformly overlapped and the widths of all fingers are equal.

* * * * *